(12) United States Patent
Bodnar et al.

(10) Patent No.: US 11,962,322 B2
(45) Date of Patent: *Apr. 16, 2024

(54) SIGNAL DEPENDENT RECONFIGURABLE DATA ACQUISITION SYSTEM

(71) Applicant: Analog Devices International Unlimited Company, Limerick (IE)

(72) Inventors: Rares Andrei Bodnar, Berkshire (GB); Sean Kowalik, Chelmsford, MA (US); William P. Buckley, Donoughmore (IE)

(73) Assignee: Analog Devices International Unlimited Company, Limerick (IE)

(*) Notice: Subject to any disclaimer, the term of this patent is extended or adjusted under 35 U.S.C. 154(b) by 0 days.

This patent is subject to a terminal disclaimer.

(21) Appl. No.: 17/931,774

(22) Filed: Sep. 13, 2022

(65) Prior Publication Data

US 2023/0006685 A1  Jan. 5, 2023

Related U.S. Application Data

(63) Continuation of application No. 17/078,774, filed on Oct. 23, 2020, now Pat. No. 11,476,863.

(60) Provisional application No. 62/932,599, filed on Nov. 8, 2019.

(51) Int. Cl.
| | | |
|---|---|---|
| *H03M 1/12* | (2006.01) | |
| *G06F 1/12* | (2006.01) | |
| *G06F 3/05* | (2006.01) | |
| *H03M 1/14* | (2006.01) | |
| *H03M 1/18* | (2006.01) | |

(52) U.S. Cl.
CPC ............ *H03M 1/1255* (2013.01); *G06F 1/12* (2013.01); *G06F 3/05* (2013.01); *H03M 1/14* (2013.01); *H03M 1/185* (2013.01)

(58) Field of Classification Search
CPC ...... H03M 1/1255; H03M 1/14; H03M 1/185; G06F 1/12; G06F 3/05
USPC .......................................... 341/139, 141, 155
See application file for complete search history.

(56) References Cited

U.S. PATENT DOCUMENTS

| | | | |
|---|---|---|---|
| 5,668,551 A | 9/1997 | Garavan et al. | |
| 6,433,727 B1 | 8/2002 | Yoshinaga | |
| 6,452,373 B2* | 9/2002 | Medelius | G01R 19/0053 324/72 |
| 7,098,834 B2 | 8/2006 | Linder et al. | |

(Continued)

FOREIGN PATENT DOCUMENTS

| | | |
|---|---|---|
| CN | 107222268 B | 8/2020 |
| JP | 5771737 B2 | 9/2015 |

OTHER PUBLICATIONS

"U.S. Appl. No. 17/078,774, Non Final Office Action dated Mar. 3, 2022", 10 pgs.

(Continued)

*Primary Examiner* — Khai M Nguyen
(74) *Attorney, Agent, or Firm* — Schwegman Lundberg & Woessner, P.A.

(57) ABSTRACT

A data acquisition system comprises a signal processing chain including an analog-to-digital converter (ADC) circuit configured to: produce a digital output from an input signal; detect a specified signal feature of the input signal; and change an operating condition of an additional circuit of the signal processing chain in response to detecting the signal feature of the input signal.

20 Claims, 4 Drawing Sheets

(56) References Cited

U.S. PATENT DOCUMENTS

| | | | |
|---|---|---|---|
| 7,138,820 B2 | 11/2006 | Goetting et al. | |
| 7,253,763 B2 | 8/2007 | Garlapati et al. | |
| 7,446,690 B2 | 11/2008 | Kao | |
| 7,760,122 B1 | 7/2010 | Zortea | |
| 7,911,365 B2 | 3/2011 | Cao et al. | |
| 8,082,115 B2 | 12/2011 | Bechhoefer et al. | |
| 8,411,707 B2 * | 4/2013 | Molina | H03M 1/0872 370/537 |
| 8,587,461 B1 * | 11/2013 | Mitchell | H03M 1/1225 341/130 |
| 9,606,603 B2 | 3/2017 | Bodner et al. | |
| 9,612,993 B2 * | 4/2017 | Field | G06F 1/266 |
| 10,725,448 B2 | 7/2020 | Willis et al. | |
| 10,756,746 B2 | 8/2020 | Hong et al. | |
| 2021/0143831 A1 | 5/2021 | Bodnar et al. | |

OTHER PUBLICATIONS

"U.S. Appl. No. 17/078,774, Notice of Allowance dated Jun. 13, 2022", 8 pgs.
"U.S. Appl. No. 17/078,774, Response filed May 27, 2022 to Non Final Office Action dated Mar. 3, 2022", 7 pgs.
Kandadai, Venkatraman, et al., "A comprehensive embedded solution for data acquisition and communication using FPGA", Journal of Applied Research and Technology, 15(1), (2017), 9 pgs.

* cited by examiner

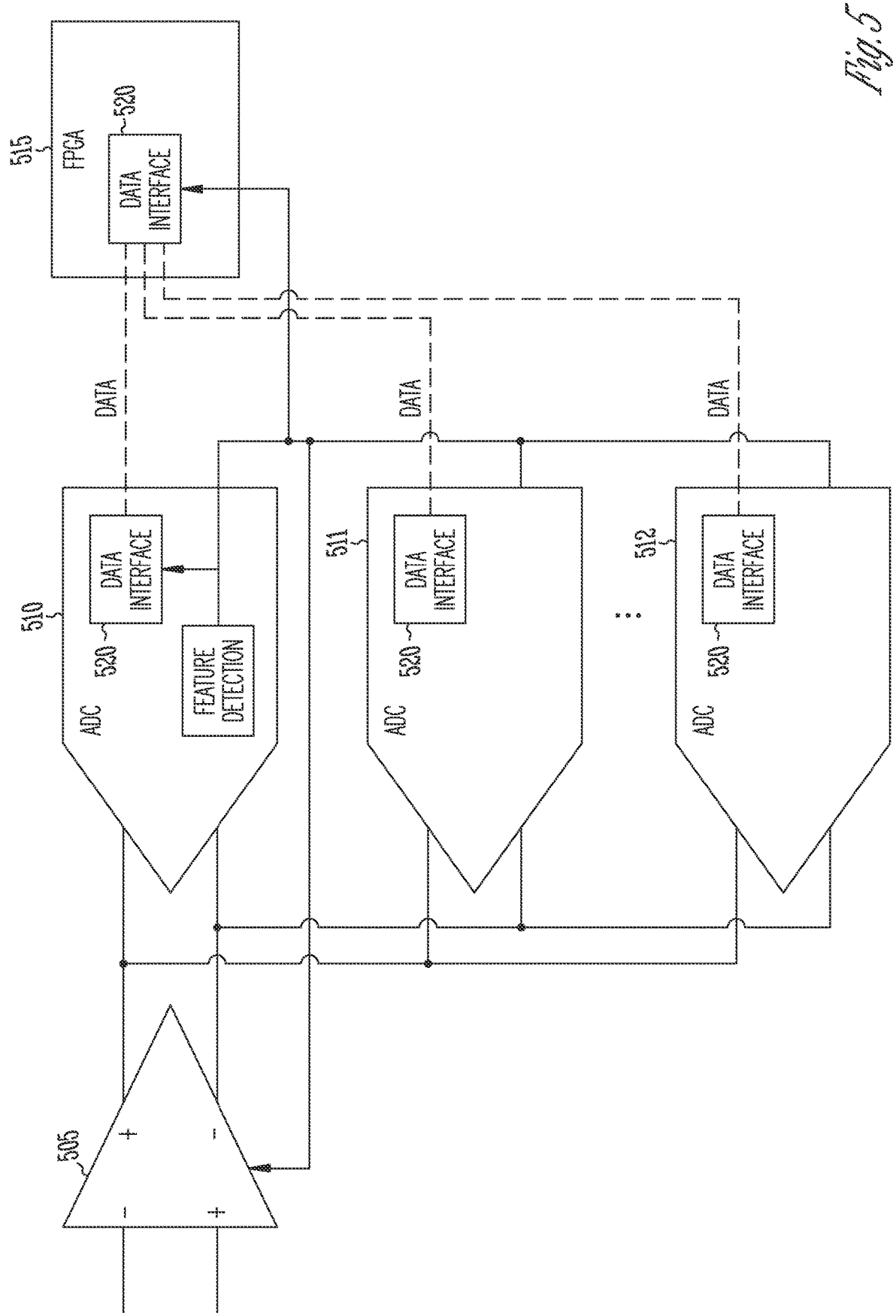

SIGNAL DEPENDENT RECONFIGURABLE DATA ACQUISITION SYSTEM

CLAIM OF PRIORITY

This application is a continuation of U.S. patent application Ser. No. 17/078,774, filed Oct. 23, 2020, which claims the benefit of priority to U.S. Provisional Patent Application Ser. No. 62/932,599, filed Nov. 8, 2019, both of which are incorporated herein in their entirety.

BACKGROUND

Data acquisition systems can be used for remote monitoring of electronic systems. Analog signals from sensors can be quantified and the quantified signals can be analyzed using a computing system that makes decisions on the operation of the monitored system. Continuous monitoring data acquisition applications are becoming widespread and in a majority of cases require power efficiency. However, some portions of a conventional data acquisition system do not meet the desired power efficiency requirements. The present inventors have recognized a need for improved data acquisition systems.

OVERVIEW

This document relates generally to data acquisition systems and in particular to improving the power efficiency of data acquisition systems. An example data acquisition system includes a signal processing chain including an analog-to-digital converter (ADC) circuit configured to produce a digital output from an input signal, detect a specified signal feature of the input signal, and change an operating condition of an additional circuit of the signal processing chain in response to detecting the signal feature of the input signal.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5 is a block diagram of a further example of a signal processing chain of a data acquisition system.

DETAILED DESCRIPTION

Figure 1:
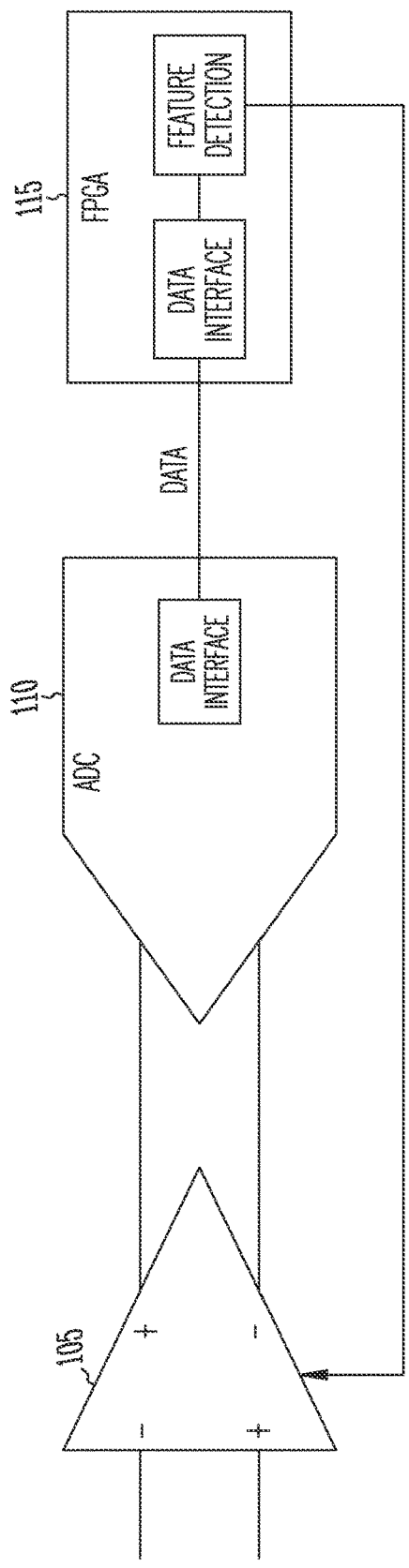
FIG. 1 is a block diagram of an example of a signal processing chain of a data acquisition system.

Continuous monitoring data acquisition applications (e.g., monitoring for partial discharge of electrical components, or monitoring for acoustic emissions in electromechanical systems) are becoming widespread and in a majority of cases require power efficiency in the system. FIG. 1 is a block diagram of an example of a signal processing chain of a data acquisition system. The electronic components of the signal processing chain include an input amplifier 105, an analog-to digital converter (ADC) circuit 110, and a field programmable gate array (FPGA) 115.

The input amplifier 105 can be a differential input differential output amplifier as shown, or the amplifier may have a single-ended output. In variations, the input amplifier 105 may have a single-ended input and a differential output. The ADC circuit 110 can be a successive approximation register analog-to digital converter (SAR ADC). An SAR ADC converts an analog input signal to produce an M bit (e.g., 8, 12, or 16 bit) digital output value using a successive approximation algorithm. The FPGA 115 includes logic circuitry to make decisions about operation of other parts of the system based on the acquired data. For example, the analog input signal may be generated by an electronic sensor, and the logic circuitry changes operation of an electronic system based on the detected events.

The electronic components included in the signal processing chain operate at full power (and full speed) waiting to detect an event in the signal input to the signal processing chain. In some monitoring applications (e.g., remote pipeline sensing or remote bridge sensing) the data sensitive events of interest are isolated events that occur a few times per day or a few times per month. Energy could be saved if the signal processing chain could be operated in a reduced power state until the sensor signal includes an event that causes the signal processing chain to be changed to a full power mode.

However, for the configuration in FIG. 1, the data interface between the ADC circuit 110 and the FPGA 115 needs to be always ON to monitor the signal, even when the signal doesn't contain relevant information. Further, the configuration of FIG. 1 includes a significant delay due to latency of the data interface, which can be several conversion cycles of the ADC circuit. This latency can make the response time too slow for certain applications, and the amplifier must be operated in full power at all times. Improved energy efficiency can be realized by moving the control of the signal processing chain to the ADC circuit.

Figure 2:
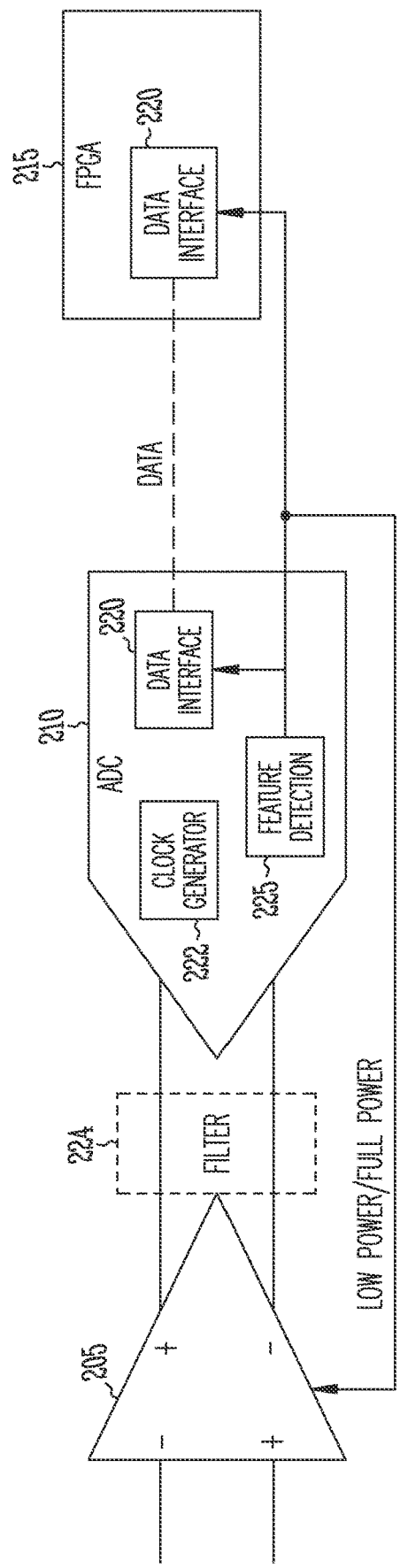
FIG. 2 is a block diagram of another example of a signal processing chain of a data acquisition system.

FIG. 2 is a block diagram of another example of a signal processing chain of a data acquisition system. The signal processing chain includes an input amplifier circuit 205, an ADC circuit 210, and an FPGA 215 or other component that includes logic circuitry to perform the functions described regarding the FPGA 215 (e.g., a complex programmable logic device (CPLD), a microcontroller, an application specific integrated circuit (ASIC), or other data processing unit). The ADC circuit 210 may be an SAR ADC, pipeline ADC, flash ADC, dual slope ADC, or other ADC. In the configuration of FIG. 2, the ADC circuit 210 operates as the master controller of the signal processing chain and as the event detector. The ADC circuit 210 includes a feature detection circuit 225 that detects a specified signal feature of the input signal and the ADC circuit 210 changes an operating condition of at least one of the other circuits of the signal processing chain in response to detecting the specific signal feature.

For example, the specific signal feature detected by the ADC circuit 210 may be that the amplitude of the input signal exceeds a specified threshold amplitude. The ADC circuit 210 may include a logic circuit to detect when the digital result exceeds a specified threshold corresponding to the input signal exceeding the specified threshold amplitude.

In other examples, the ADC circuit 210 may detect that the energy within a specific bandwidth of the input signal exceeds a specified threshold energy, that the root-mean-square (RMS) value of the input signal exceeds a specified RMS value, or that the rate of change of the input signal (e.g., dV/dt) exceeds a specified threshold rate of change. These functions can be integrated in low geometry designs with the ADC circuit. Additionally, by allowing the ADC circuit 210 to control the signal chain operating regime it can reduce the overall latency by more than two to three ADC cycles, which can be critical for capturing high-frequency events in the input signals.

When initially monitoring the input signal, the ADC circuit 210 may toggle the FPGA 215 to a powered down or low power state. When the specific signal feature is detected in the input signal, the ADC circuit 210 toggles the FPGA 215 to a full power state. In some aspects, the ADC circuit 210 may toggle the data interface 220 between the ADC circuit 210 and the FPGA 215 to the low power state when monitoring the input signal and toggle operation of the data interface 220 to the high power state in response to detecting the signal feature of the input signal.

Figure 3:
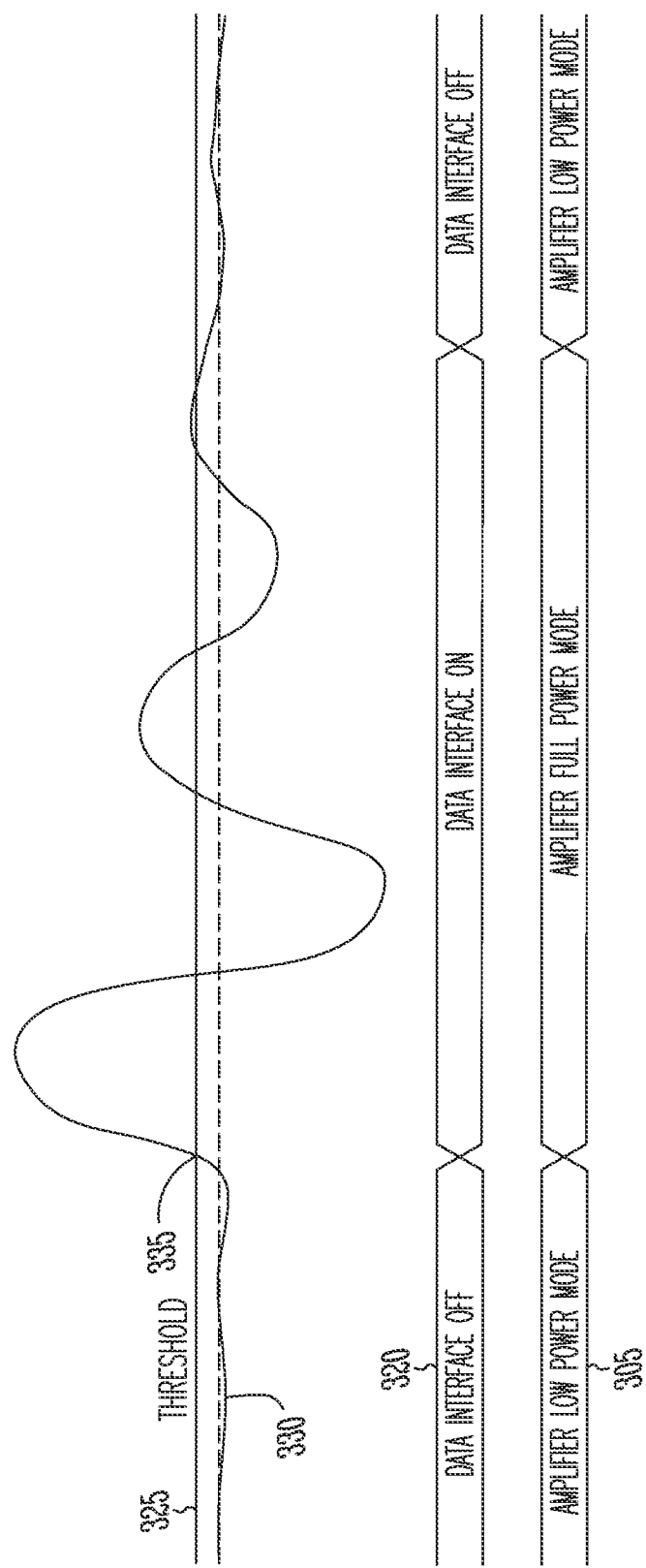
FIG. 3 is an illustration of waveforms associated with operation of the signal processing chain of FIG. 2.

FIG. 3 is an illustration of an example of waveforms associated with operation of the signal processing chain of FIG. 2. Waveform 330 represents the input signal to the signal processing chain. The waveform 330 may represent voltage versus time for a signal provided from an electronic sensor. In the example, the data interface and the input amplifier are in the low power state. In response to a feature of the input signal, the ADC circuit toggles the data interface and the input amplifier to the full power state to process the input signal. When the feature is no longer present in the input signal, the ADC circuit returns the signal processing chain to the low power state.

Waveform 320 represents the state of the data interface 220. In the example of FIG. 3, the feature detection circuit 225 detects when the magnitude of the input signal is greater than a specified threshold voltage represented by voltage level 325. When the input signal waveform 330 is less than the specified threshold voltage, the ADC circuit 210 holds the data interface 220 in an off state. When the input signal waveform 330 exceeds the specified threshold voltage at 335, the ADC circuit 210 turns the data interface 220 on. The ADC circuit 210 keeps the data interface on until the peak-to-peak amplitude of the input signal becomes lower than the specified threshold voltage, at which point the data interface is turned off. In certain aspects, the ADC circuit 210 may delay turning off the data interface for a specified number of analog-to-digital (A/D) conversion cycles, or may use hysteresis in turning on and off the data interface 220 (e.g., the specified turn-on threshold may be higher than the specified turn-off threshold).

Returning to FIG. 2, the date interface 220 may be a low voltage differential signal (LVDS) interface. An LVDS interface can consume between ten milliwatts (10 mW) and 30 mW for transmitting and receiving between the ADC circuit 210 and the FPGA 215. The FPGA 215 can also add significant power to the signal processing. Thus, the power of the signal chain can be reduced two to three times by dynamically changing the signal chain operating mode based on the signal characteristics detected by the ADC circuit 210.

The ADC circuit can include a clock generator circuit 222 that provides an operating clock signal with a selectable frequency to one or both of the data interface and the logic circuitry. In the alternative, or in addition to, toggling the power mode of the FPGA 215 and the data interface 220, the ADC circuit 210 changes the frequency of the operating clock signal of one or both of the data interface 220 and the logic circuitry of the FPGA 215 when the signal feature is detected. The ADC circuit 210 may also change the A/D conversion rate. A slower clock frequency and lower conversion rate can reduce the operating power of the data interface 220, ADC 210, and FPGA 215, and may be part of operating the data interface 220 and FPGA 215 in a low power mode. Increasing the clock frequency can increase the time resolution for the A/D conversion for that period of time that the input signal exhibits the specified signal feature. In the absence of the specified signal feature, the ADC circuit 210 reverts to a lower conversion rate in order to save power.

In some aspects, the input amplifier circuit 205 of the signal processing chain is configured to operate in multiple power modes including a low power mode to conserve power and a high power mode. In the high power mode, the input amplifier is in a higher performance mode and the output of the input amplifier may have lower signal noise than when the input amplifier is in the lower power mode.

Returning to FIG. 3, waveform 305 represents the state of the input amplifier circuit 205. When the magnitude of the input signal waveform 330 is less than the specified threshold voltage 325, the ADC circuit 210 holds the input amplifier in the low power mode. When the magnitude of the input signal waveform 330 exceeds the specified threshold voltage at 335, the ADC circuit 210 changes the input amplifier to the high power mode or full power mode as shown in waveform 305. The ADC circuit 210 keeps the input amplifier in the high power mode until the peak-to-peak amplitude of the input signal becomes lower than the specified threshold voltage, at which point the changes in the input amplifier back to the low power mode.

In some aspects, the feature detection can be used for fast overvoltage protection of the ADC inputs. If the specified feature is a specified signal amplitude threshold and the threshold is set in the vicinity of the full scale (or zero scale) value, the ADC will automatically shut down the input amplifier, protecting the amplifier input circuits.

According to some aspects, the signal processing chain provides filtering to the input signal. The filtering can be a programmable characteristic of the input amplifier circuit 205 (e.g., by placing a programmable array of capacitors in parallel with feedback resistors of the amplifier). In certain aspects, the filtering can be provided by a separate filtering circuit 224 that has programmable filtering. A filtering circuit 224 separate from the input amplifier circuit 205 can be positioned between the input amplifier and the ADC circuit 210 as shown in FIG. 2 or can be positioned before the input amplifier. The characteristics of the filtering can be selectable by the ADC circuit 210 and changed by the ADC circuit 210 in response to detecting the specified signal feature. For example, the ADC circuit 210 may change the bandwidth of the filtering to reduce noise on the input signal.

Figure 4:
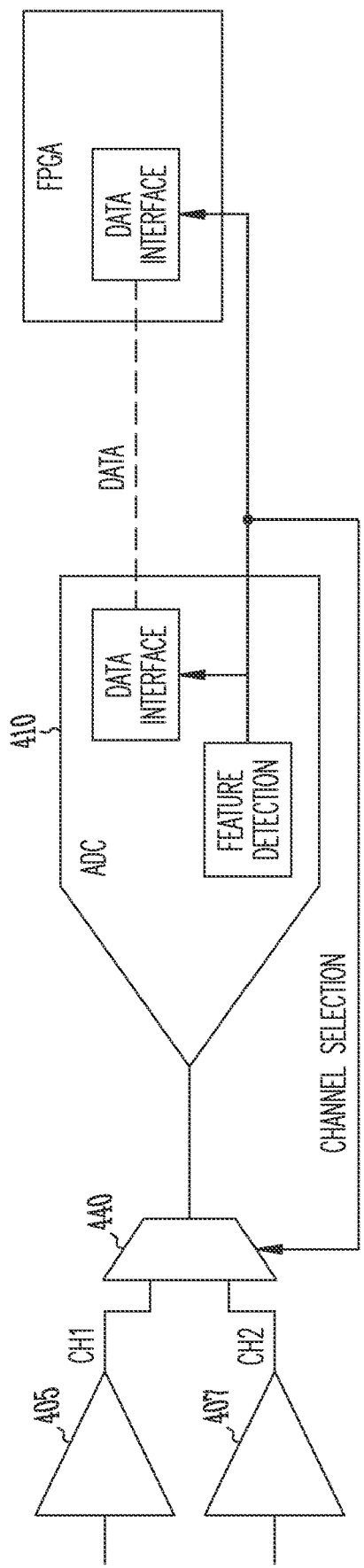
FIG. 4 is a block diagram of another example of a signal processing chain of a data acquisition system.

FIG. 4 is a block diagram of another example of a signal processing chain for a data acquisition system. The signal processing chain has changeable gain at the front end of the signal processing chain. The signal processing chain includes two input amplifiers 405, 407 and a multiplexer circuit 440 to select between the two amplifiers. The two amplifiers have their inputs connected to the same input signal, but the input amplifiers are configured with different gain values. Thus, in order to maximize the dynamic range, the channel selection by the ADC circuit 410 based on the detected signal feature will toggle to the channel with the optimum gain configuration, without saturating the input of the selected amplifier.

In some embodiments, the two input amplifiers 405, 407 are connected to two separate input channels. The input channels may be connected to separate sensors and the input channels receive separate input signals. In normal operation the ADC circuit 410 keeps toggling between the two input channels by controlling the multiplexer circuit 440. When the specified signal feature is detected on a specific channel, the multiplexer selection code is selected and frozen, and the ADC converts at full throughput the input signal of that input channel. Thus, the full throughput may be committed to the input signal that has activity or exhibits a change. In variations, there are more than two input channels with an input amplifier coupled to each of the input channels.

FIG. 5 is a block diagram of another example of a signal processing chain of a data acquisition system. The signal processing chain includes multiple ADC circuits, e.g., N ADC circuits, where N is an integer greater than one. The N ADC circuits are connected in parallel to each convert the input signal to a digital value. One ADC circuit 510 may operate as the master controller of the signal processing chain and as the event detector. In the absence of the specified signal feature, the master ADC circuit 510 may disable the other ADC circuits (511, 512), the FPGA 515, and the data interface 520. The master ADC circuit 510 may enable a low power mode in the input amplifier 505. In response to detecting the signal feature of the input signal, the master ADC circuit 510 activates or otherwise synchronizes operation of the other ADC circuits in parallel to produce N samples of the input signal in parallel. The N samples can be used to produce a low noise and/or averaged value of the input signal within a specific time window determined by the master ADC circuit 510.

According to some aspects, the multiple ADC circuits receive different input signals for conversion, and the conversion of the other input signals is synchronized by the master ADC circuit 510 in response to the ADC circuit 510 detecting the specified signal feature. The input signals may be provided by an array of sensors. In certain aspects, the sensors may be used to monitor the same object (e.g., a bridge) at different points of the object. In other aspects, the sensors of the array are different types of sensors to monitor different characteristics of the object.

The devices, methods, and systems described herein can provide improved energy efficiency and low latency in for data acquisition for an application where the events of interest occur with low frequency. The improved energy efficiency and latency results from placing the control of the system with an ADC circuit that can autonomously toggle the power mode, gain, signal chain configuration, depending on the characteristics of the input signal in order to save power, improve the signal-to-noise ratio (SNR) and total harmonic distortion (THD) in sampling of the input signal.

Additional Description and Aspects

A first Aspect (Aspect 1) includes subject matter (such as a data acquisition system) comprising an analog-to-digital converter (ADC) circuit configured to produce a digital output from an input signal, detect a specified signal feature of the input signal, and change an operating condition of an additional circuit of the signal processing chain in response to detecting the signal feature of the input signal.

In Aspect 2, the subject matter of Aspect 1 optionally includes a signal processing chain including logic circuitry and a data interface coupled to the ADC circuit and the logic circuitry, wherein the ADC circuit is configured to enable operation of the data interface in response to detecting the signal feature of the input signal.

In Aspect 3, the subject matter of Aspect 2 optionally includes an ADC circuit that includes a clock generator circuit configured to provide an operating clock signal with a selectable frequency to one or both of the data interface and the logic circuitry, and change the frequency of the operating clock signal in response to detecting the signal feature of the input signal.

In Aspect 4, the subject matter of one or both of Aspects 2 and 3 optionally include an ADC circuit configured to enable the logic circuitry in response to detecting the signal feature of the input signal.

In Aspect 5, the subject matter of one or any combination of Aspects 1-4 optionally includes a signal processing chain that includes an input amplifier circuit configured to operate in multiple power modes to provide the input signal to the ADC circuit; and the ADC circuit is configured to change the power mode of the input amplifier in response to detecting the signal feature of the input signal.

In Aspect 6, the subject matter of Aspect 5 optionally includes an ADC circuit is configured to change an analog-to-digital conversion rate in response to detecting the signal feature of the input signal.

In Aspect 7, the subject matter of one or both of Aspects 5 and 6 optionally includes a filter circuit coupled to the input of the ADC circuit, and the filter circuit has selectable filter characteristics and the ADC circuit is configured to change the filtering characteristics of the filter circuit in response to detecting the signal feature of the input signal.

In Aspect 8, the subject matter of one or any combination of Aspects 1-7 optionally includes a signal processing chain that further includes one or more other ADC circuits and the ADC circuit is configured to synchronize operation of the other ADC circuits in response to detecting the signal feature of the input signal.

In Aspect 9, the subject matter of one or any combination of Aspects 1-8 optionally includes multiple signal paths connectable to the ADC circuit, and the ADC circuit is configured to select the signal path connected to the ADC circuit in response to detecting the signal feature of the input signal.

In Aspect 10, the subject matter of one or any combination of Aspects 1-9 optionally includes an ADC circuit configured to detect one or more of an amplitude of the input signal exceeding a specified threshold amplitude, energy within a specific bandwidth of the input signal exceeding a specified threshold energy, a root-mean-square (RMS) value of the input signal exceeds a specified RMS value, or a rate of change of the input signal exceeding a specified threshold rate of change.

Aspect 11 can include subject matter (such as a method of processing an analog signal) or can optionally be combined with one or any combination of Aspects 1-10 to include such subject matter, comprising producing a digital output from the analog signal using an ADC circuit of a signal processing chain of a data acquisition system; detecting a specified signal feature of the analog signal using the ADC circuit; and changing, by the ADC circuit, an operating condition of an additional circuit of the signal processing chain in response to the detecting the predetermined signal feature.

In Aspect 12, the subject matter of Aspect 11 optionally includes the ADC circuit enabling a data interface between the ADC circuit and logic circuitry of the signal processing chain in response to detecting the signal feature of the input signal.

In Aspect 13, the subject matter of Aspect 12 optionally includes the ADC circuit changing a frequency of an operating clock signal of one or both of the data interface and the logic circuitry in response to detecting the signal feature of the input signal.

In Aspect 14, the subject matter of one or both of Aspects 12 and 13 optionally includes the ADC circuit enabling the logic circuitry in response to detecting the signal feature of the input signal.

In Aspect 15, the subject matter of one or any combination of Aspects 11-14 optionally includes the ADC circuit a power mode of an input amplifier of the signal processing chain in response to detecting the signal feature of the input signal.

In Aspect 16, the subject matter of one or any combination of Aspect 15 optionally includes the ADC circuit changing an analog-to-digital conversion rate in response to detecting the signal feature of the input signal.

In Aspect 17, the subject matter of one or both of Aspects 15 and 16 optionally includes the ADC circuit changing the filtering characteristics of a filter circuit of the signal processing chain in response to detecting the signal feature of the input signal.

In Aspect 18, the subject matter of one or any combination of Aspects 11-17 optionally includes the ADC circuit synchronizing operation of other ADC circuits in response to detecting the signal feature of the input signal.

In Aspect 19, the subject matter of one or any combination of Aspects 11-18 optionally includes the ADC circuit changing a signal path connected to the ADC circuit in response to detecting the signal feature of the input signal.

Aspect 20 can include subject matter (such as a data acquisition system) or can optionally be combined with one or any combination of Aspects 1-19 to include such subject matter, comprising an analog-to-digital converter (ADC) circuit configured to produce a digital output from an analog input signal using an analog-to-digital converter (ADC) circuit of a signal processing chain of the data acquisition system, means for detecting a specified signal feature of the analog input signal, and means for changing an operating condition of an additional circuit of the signal processing chain in response to the detecting the predetermined signal feature.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A signal processing chain of a data acquisition system, the signal processing chain including:
   logic circuitry;
   a data interface; and
   an analog-to-digital converter (ADC) circuit configured to produce a digital output from an input signal and detect a specified signal feature of the input signal, and wherein the ADC circuit includes a clock generator circuit configured to provide an operating clock signal with a selectable frequency to one or both of the data interface and the logic circuitry, and change the frequency of the operating clock signal in response to detecting the signal feature of the input signal.

2. The signal processing chain of claim 1, wherein the ADC circuit is configured to enable operation of the data interface in response to detecting the signal feature of the input signal.

3. The signal processing chain of claim 1, wherein the ADC circuit is configured to enable the logic circuitry in response to detecting the signal feature of the input signal.

4. The signal processing chain of claim 1, including:
   an input amplifier circuit configured to operate in multiple power modes to provide the input signal to the ADC circuit;
   wherein the ADC circuit is configured to change the power mode of the input amplifier in response to detecting the signal feature of the input signal.

5. The signal processing chain of claim 1, wherein the ADC circuit is configured to change an analog-to-digital conversion rate in response to detecting the signal feature of the input signal.

6. The signal processing chain of claim 1, including:
a filter circuit coupled to the input of the ADC circuit; and
wherein the filter circuit has selectable filter characteristics and the ADC circuit is configured to change the filtering characteristics of the filter circuit in response to detecting the signal feature of the input signal.

7. The signal processing chain of claim 1, including one or more other ADC circuits and the ADC circuit is configured to synchronize operation of the other ADC circuits in response to detecting the signal feature of the input signal.

8. The signal processing chain of claim 1, including:
multiple signal paths connectable to the ADC circuit; and
wherein the ADC circuit is configured to select the signal path connected to the ADC circuit in response to detecting the signal feature of the input signal.

9. The signal processing chain of claim 1, wherein the ADC circuit is configured to detect one or more of an amplitude of the input signal exceeding a specified threshold amplitude and a rate of change of the input signal exceeding a specified threshold rate of change.

10. A method of processing an analog signal, the method comprising:
producing a digital output from the analog signal using an analog-to-digital converter (ADC) circuit of a signal processing chain of a data acquisition system;
detecting a specified signal feature of the analog signal using the ADC circuit; and
changing, by the ADC circuit, a signal path of the signal processing chain connected to the ADC circuit in response to the detecting the predetermined signal feature.

11. The method of claim 10, including the ADC circuit enabling a data interface between the ADC circuit and logic circuitry of the signal processing chain in response to detecting the signal feature of the input signal.

12. The method of claim 10, including the ADC circuit changing a frequency of an operating clock signal of a data interface between the ADC circuit and logic circuitry of the signal processing chain in response to detecting the signal feature of the input signal.

13. The method of claim 10, including the ADC circuit enabling logic circuitry of the signal processing chain in response to detecting the signal feature of the input signal.

14. The method of claim 10, including the ADC circuit changing a power mode of an input amplifier of the signal processing chain in response to detecting the signal feature of the input signal.

15. The method of claim 10, including the ADC circuit changing an analog-to-digital conversion rate in response to detecting the signal feature of the input signal.

16. The method of claim 10, wherein changing an operating condition of an additional circuit includes the ADC circuit changing the filtering characteristics of a filter circuit of the signal processing chain in response to detecting the signal feature of the input signal.

17. The method of claim 10, wherein changing an operating condition of an additional circuit includes the ADC circuit synchronizing operation of other ADC circuits in response to detecting the signal feature of the input signal.

18. A data acquisition device comprising:
multiple analog-to-digital converter (ADC) circuits configured to produce a digital output from one or more analog input signals;
means for detecting a specified signal feature of the one or more analog input signals; and
means for synchronizing operation of the multiple ADC circuits in response to the detecting the specified signal feature of the one or more analog input signals.

19. The data acquisition device of claim 18, including means for changing an analog-to-digital conversion rate of one or more of the multiple ADC circuits in response to detecting the specified signal feature of the one or more analog input signals.

20. The data acquisition device of claim 18, including means for changing a frequency of an operating clock signal of a data interface to one or more of the ADC multiple circuits in response to detecting the specified signal feature of the one or more analog input signals.

* * * * *